US006538480B2

(12) United States Patent
Takada et al.

(10) Patent No.: US 6,538,480 B2
(45) Date of Patent: Mar. 25, 2003

(54) LOAD DRIVING DEVICE

(75) Inventors: Kouji Takada, Kyoto (JP); Seiki Yamaguchi, Shiga (JP); Satoru Takahashi, Shiga (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/946,295

(22) Filed: Sep. 4, 2001

(65) Prior Publication Data
US 2002/0039037 A1 Apr. 4, 2002

(30) Foreign Application Priority Data
Sep. 21, 2000 (JP) .................................... 2000-287397

(51) Int. Cl.[7] ................................................ H03K 3/00
(52) U.S. Cl. ...................... 327/108; 327/427; 327/380
(58) Field of Search ............................. 327/108, 109, 327/110, 111, 112, 50, 380, 427, 434, 538, 543, 545, 546; 361/18, 82, 88, 89, 91.1–91.3, 93.1, 93.7–93.9, 94, 103

(56) References Cited

U.S. PATENT DOCUMENTS

| | | | | |
|---|---|---|---|---|
| 5,396,117 A | * | 3/1995 | Housen et al. ............ 327/480 |
| 5,422,593 A | * | 6/1995 | Fujihira ..................... 327/561 |
| 5,432,471 A | * | 7/1995 | Majumdar et al. .......... 327/380 |
| 5,550,702 A | * | 8/1996 | Schmidt et al. ............ 361/103 |
| 5,568,347 A | * | 10/1996 | Shirai et al. ................. 361/98 |
| 5,710,508 A | | 1/1998 | Watanabe .................. 323/384 |
| 5,901,026 A | * | 5/1999 | Furuno ....................... 361/101 |
| 5,942,881 A | * | 8/1999 | Okada et al. .............. 323/277 |

FOREIGN PATENT DOCUMENTS

JP   6-284564   10/1994

* cited by examiner

Primary Examiner—Timothy P. Callahan
Assistant Examiner—Hai L. Nguyen
(74) Attorney, Agent, or Firm—Merchant & Gould P.C.

(57) ABSTRACT

A load driving device capable of preventing thermal destruction even when a load short-circuit or an overcurrent occurs, thereby having improved reliability, is provided. A load driving device, in which a power switch element for driving a load and a circuit for controlling the power switch element according to a signal $V_{IN}$ supplied from the outside are formed on one chip, is provided with an OFF-time delaying circuit for delaying an OFF-time transition of a level of an input signal at which the power switch element makes the transition from an ON state to an OFF state, according to a result of detection of a current flowing through the load and the level of the input signal to the power switch element.

10 Claims, 5 Drawing Sheets

LOAD DRIVING DEVICE

BACKGROUND OF THE INVENTION

1. Field of the Invention

The present invention relates generally to a load driving device for driving a load such as a lamp, an LED, or an inductor, and particularly to a technique for preventing thermal destruction of a load driving device due to heat of a power switch element composing the load driving device when an overcurrent or a short-circuit current is generated.

2. Related Background Art

Conventionally, according to a technique for driving a load such as a lamp or a coil, as shown in FIG. 4, a power source 9 is connected to a high-potential side of a load 17 while a load driving device 1' is provided on a low-potential side of the load 17, and the load 17 is driven by turning a power switch element 2 of the load driving device 1' ON/OFF according to a signal supplied to an input terminal 22 from the outside so that current from the power source 9 is passed/stopped. Such a load driving device 1' generally has various protective functions. To realize functions of load short-circuit protection and overcurrent protection among the protective functions, it is necessary to protect the load driving device 1' from thermal destruction by detecting a voltage applied to the low-potential side of the load 17, that is, a potential of a drain terminal 21 of the load driving device 1', with current detecting resistors 13 and 14, and turning the power switch element 2 OFF according to the potential detected.

The following description will depict specific load short-circuit protection and overcurrent protection, while referring to FIG. 5. FIG. 5 is a waveform diagram illustrating voltages and currents at respective parts of the load driving device 1' upon the occurrence of a load short-circuit or an overcurrent.

First of all, when a voltage $V_{IN}$ is applied to an input terminal 22 from the outside and a voltage $V_T$ obtained by dividing the voltage $V_{IN}$ with resistors 10, 11 and a resistor 12 exceeds a threshold value of a gate voltage detecting element 16, the gate voltage detecting element 16 is turned ON, thereby being in a state of monitoring a voltage $V_D$ at a drain terminal 21.

In this state, when something abnormal occurs to the load 17 thereby causing a large current to flow, the voltage $V_C$ obtained by dividing the voltage $V_D$ with the current detecting resistors 13 and 14 rises according to the current $I_L$, and a current detecting element 15 is turned ON when the voltage $V_C$ exceeds a threshold value ($V_{TH}$) of the current detecting element 15. Therefore, a gate voltage $V_G$ of the power switch element 2 drops to a ground level since the gate is grounded via a grounding terminal 23, and the power switch element 2 is turned OFF.

When the lowering of the gate voltage $V_G$ of the power switching element 2 causes the voltage $V_T$ obtained by dividing the gate voltage $V_G$ with the resistors 11 and 12 to drop to a level lower than the threshold value of the gate voltage detecting element 16, this causes the gate voltage detecting element 16 to be turned OFF, and also the current detecting element 15 to be turned OFF. As a result, again the gate voltage $V_G$ of the power switch element 2 rises, thereby again causing the power switch element to be turned ON.

The rise of the gate voltage $V_G$ of the power switch element 2 causes a voltage $V_T$ obtained by dividing the voltage $V_G$ with the resistors 11 and 12 to rise, and when the voltage $V_T$ exceeds the threshold value of the gate voltage detecting element 16, the gate voltage detecting element 16 is turned ON.

In the case where the abnormality in the load 17 causes a large current to continue flowing, the device is in an oscillation state in which the foregoing sequence of actions is repeated. Thus, to prevent thermal destruction of the load driving device 1' from occurring when a large current flows through the load 17, the functions of load short-circuit protection and 25 overcurrent protection are provided. It should be noted that the load short-circuit protection and the overcurrent protection has a difference therebetween only in a value of a current flowing through the load 17, which results in a difference in the voltage detected by the current detecting resistors 13 and 14, and the two functions are identical in the actions per se.

As shown in FIG. 5, while the voltage $V_{IN}$ continues to be applied to the input terminal 22, the oscillation state of the load current $I_L$ continues due to the load short-circuit protection and the overcurrent protection. In such an oscillation state of the load current $I_L$, the load driving device 1' generates heat, thereby causing a temperature to rise, but by providing an overheat protection circuit 18, the gate voltage $V_G$ of the power switch element 2 is caused to drop when the temperature of the load driving device 1' reaches a heating set temperature, whereby the power switch element 2 is turned OFF. Therefore, thermal destruction of the device is prevented.

The heating set temperature of the overheat protection circuit 18 usually is set in the vicinity of 150° C., which is an operating upper limit temperature of the load driving device 1'. It, however, possibly is close to 200° C. due to variation of circuit constants, and in the case where a load short-circuit or an overcurrent occurs repeatedly, the load driving device 1' possibly undergoes thermal destruction. Thus, in some cases this raises a problem in reliability of the device.

SUMMARY OF THE INVENTION

Therefore, with the foregoing in mind, it is an object of the present invention to provide a load driving device capable of avoiding thermal destruction even when a load short-circuit or an overcurrent occurs, thereby having improved reliability.

To achieve the foregoing object, a load driving device according to the present invention includes a power switch element for driving a load and a circuit for controlling the power switch element according to a signal supplied from the outside, the power switch element and the circuit being provided on one chip, and the load driving device comprises a switching time changing means for changing a time to turn the power switch element ON/OFF, according to a result of detection of a current flowing through the load and an input signal level of the power switch element. Here, the power switch element is an N-channel MOSFET or an insulated-gate bipolar transistor, each of which is a voltage-driven type, or a normal bipolar transistor, which is a current-driven type.

In the load driving device, the switching time changing means preferably includes an OFF-time delaying circuit for delaying an OFF-time transition of the input signal level at which the power switch element makes the transition from an ON state to an OFF state.

Furthermore, the OFF-time delaying circuit preferably draws its power from the signal supplied from the outside.

Furthermore, the OFF-time delaying circuit preferably delays the OFF-time transition of the input signal level for a period according to a temperature rise of the load driving device.

In this case, the load driving device preferably further includes an overheat protection circuit that detects a temperature and turns the power switch element OFF according to the detected temperature, wherein the OFF-time delaying circuit delays the OFF-time transition of the input signal level according to the temperature detected by the overheat protection circuit.

Furthermore, the OFF-time delaying circuit draws its power from a connection that connects a resistor to which the signal is supplied from the outside and a plurality of diodes connected in series in a forward direction.

With the foregoing configuration, the OFF time of the power switch element is prolonged when a load short-circuit or an overcurrent occurs, and the OFF time is set shorter at normal temperature and is increased as the temperature rises. By so doing, it is possible to surely prevent the load driving device from undergoing thermal destruction, and to improve the response speed when the device has recovered from a temporary load short-circuit or overcurrent. Thus, it is possible to improve the reliability of the device.

DETAILED DESCRIPTION OF THE INVENTION

Figure 1:
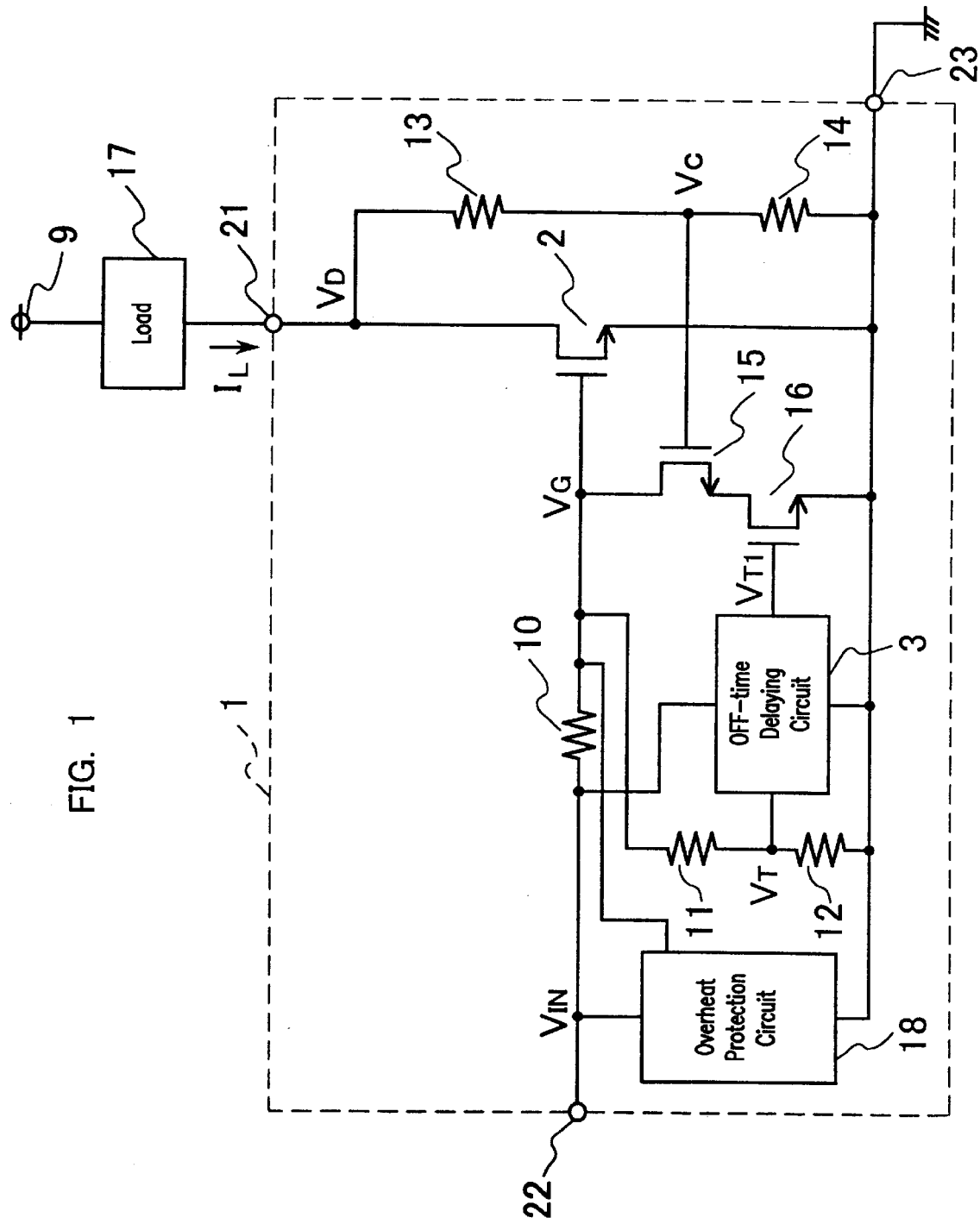
FIG. 1 is a view illustrating a configuration of a load driving device according to a first embodiment of the present invention.
Figure 4:
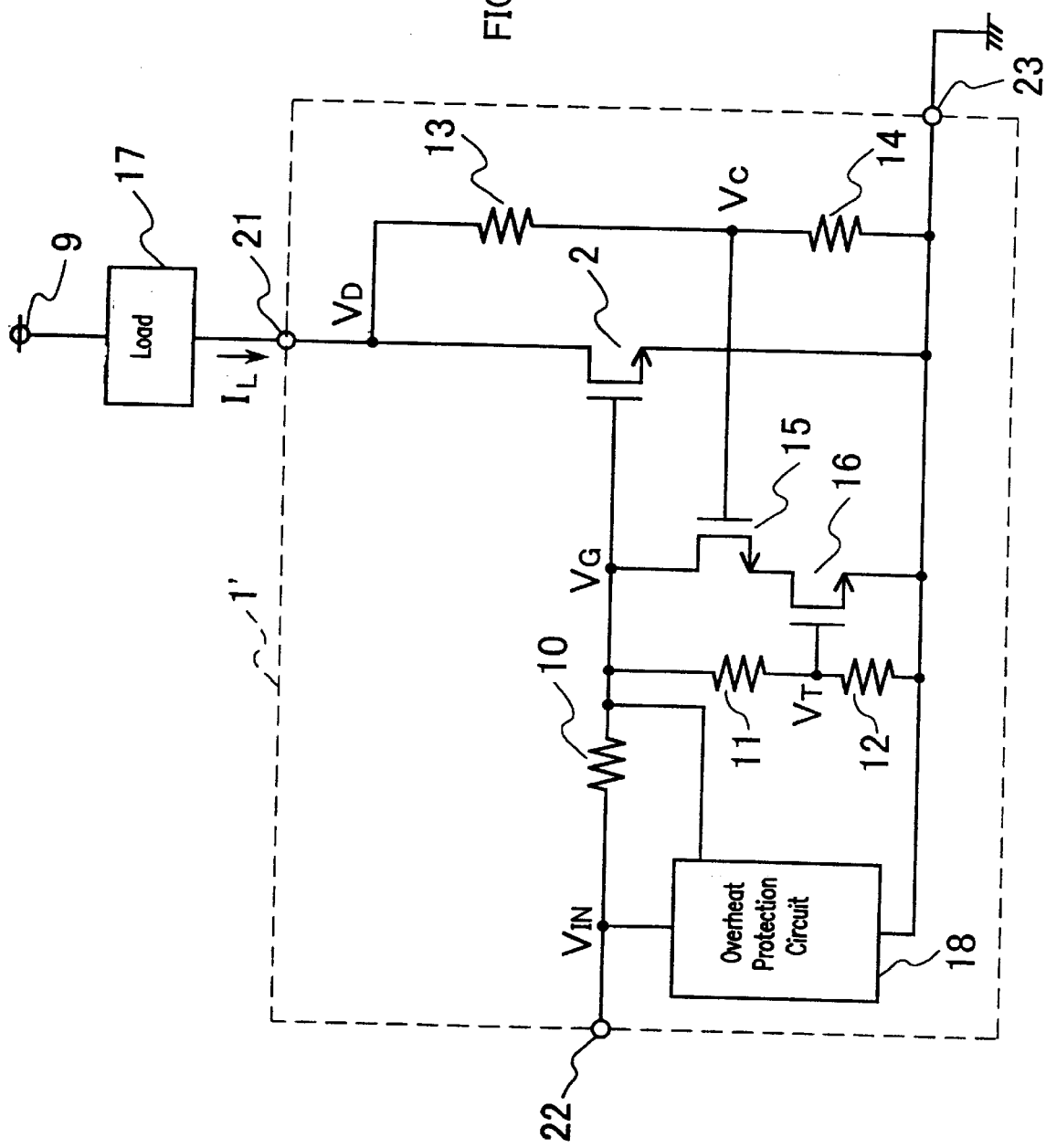
FIG. 4 is a view illustrating a configuration of a conventional load driving device.
Figure 5:
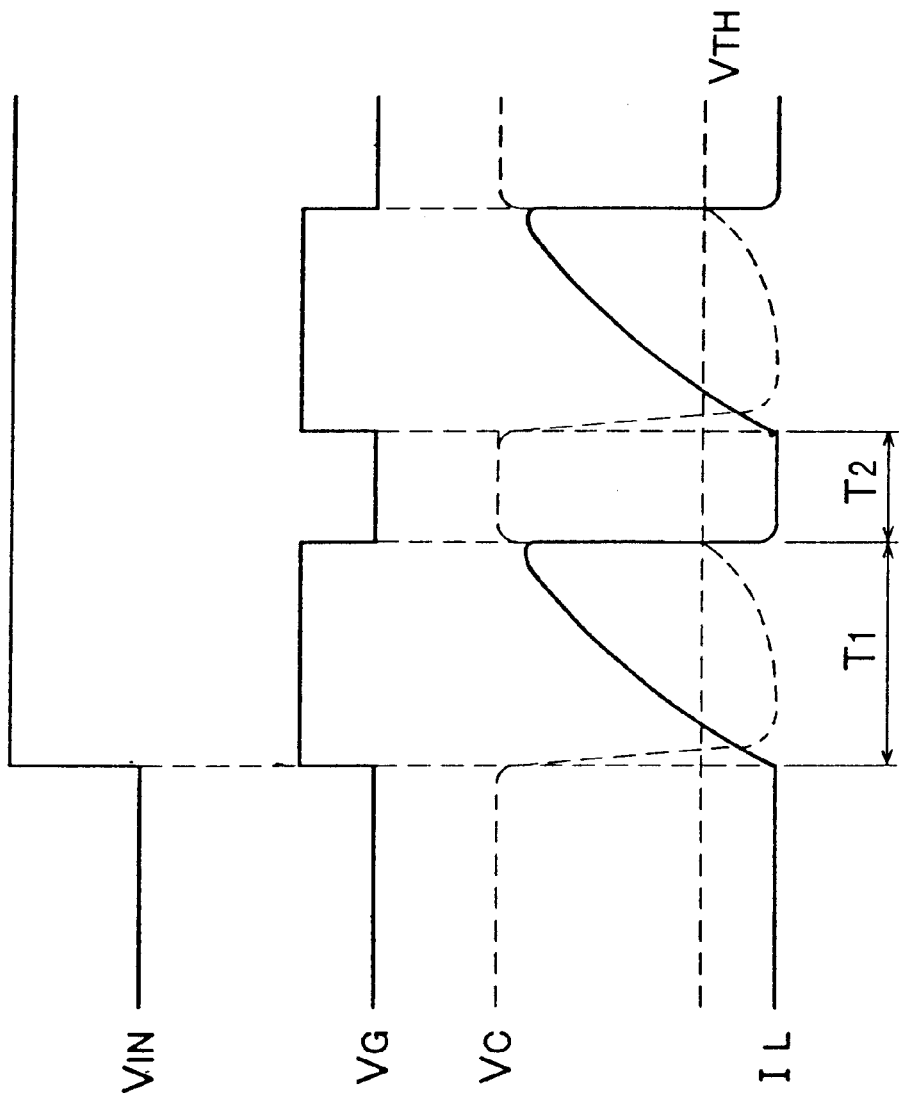
FIG. 5 is a waveform diagram showing voltages and currents at respective parts of the conventional load driving device.

The following description will depict an embodiment of the present invention, while referring to the drawings.
First Embodiment FIG. 1 is a view illustrating a configuration of a load driving device 1 according a first embodiment of the present invention. It should be noted that the same component elements as those of the conventional example shown in FIG. 4 are designated with the same referential numerals and descriptions of the same are omitted. The present embodiment differs from the conventional example in the aspect that an OFF time delaying circuit 3 for delaying the falling of the voltage $V_T$ obtained by division by resistors 11 and 12 for a predetermined time is provided on an input side of the gate voltage detecting element 16. The OFF time delaying circuit 3 is powered with the voltage $V_{IN}$ applied to an input terminal 22.

Figure 2:
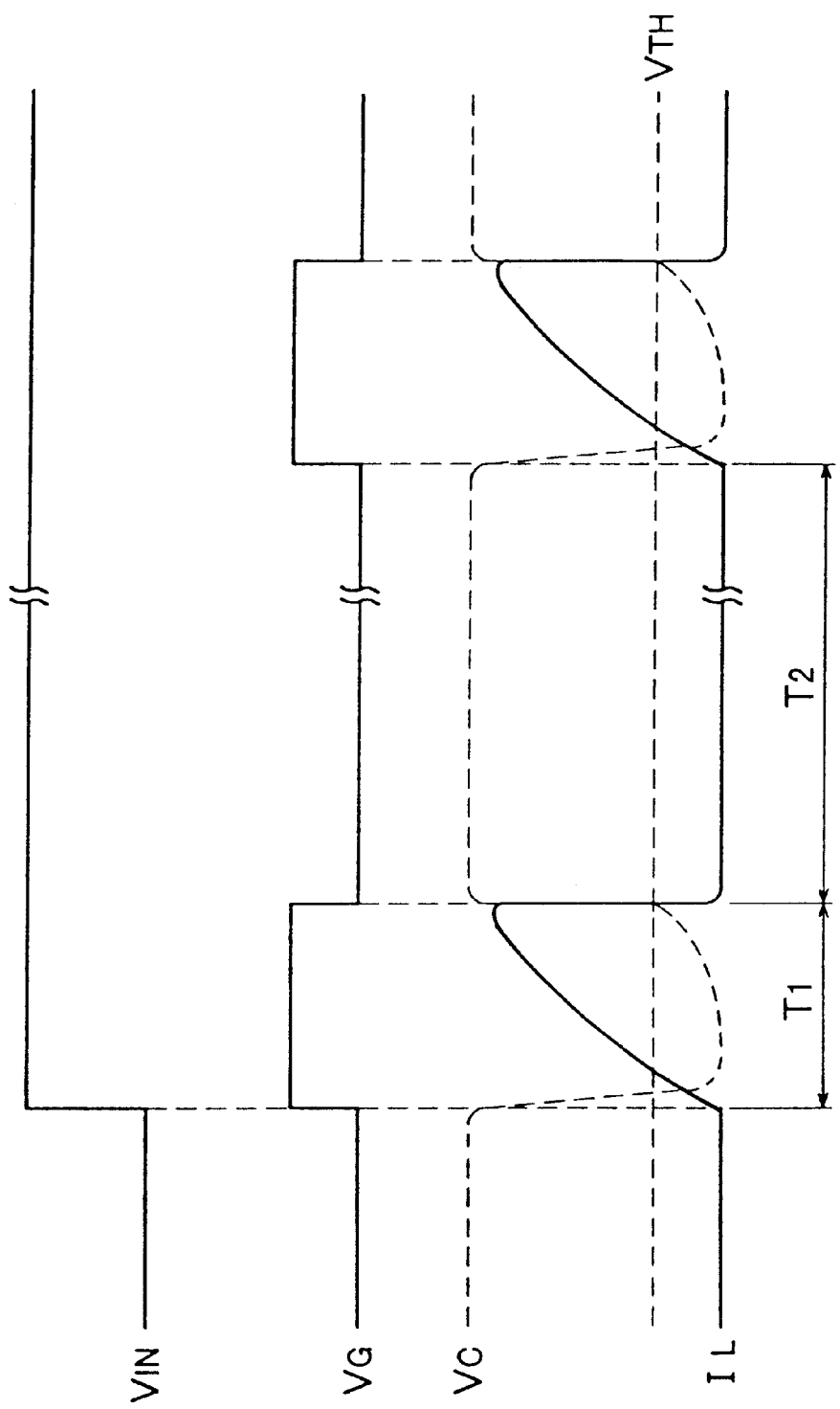
FIG. 2 is a waveform diagram showing voltages and currents at respective parts of the load driving device shown in FIG. 1 when a load short-circuit or an overcurrent occurs.

FIG. 2 is a waveform diagram of voltages or currents at respective parts of the load driving device 1 upon the occurrence of a load short-circuit or an overcurrent.

The following description will depict functions of load short-circuit protection and overcurrent protection according to the present embodiment, while referring to FIGS. 1 and 2.

First of all, when a voltage $V_{IN}$ is applied to the input terminal 22 from the outside, a voltage $V_T$ obtained by dividing the voltage $V_{IN}$ with the resistors 10, 11 and the resistor 12 rises. The voltage $V_T$ is fed to the OFF-time delaying circuit 3, but the OFF-time delaying circuit 3 does not operate to delay the rise of the voltage $V_T$. The voltage $V_T$ is outputted to a gate voltage detecting element 16 as a voltage $V_{T1}$. When the voltage $V_{T1}$ exceeds a threshold value of the gate voltage detecting element 16, the gate voltage detecting element 16 is turned ON, so that a voltage $V_D$ at a drain terminal 21 is monitored.

In this state, when something abnormal occurs to a load 17 thereby causing a large current to flow, a voltage $V_C$ obtained by dividing the voltage $V_D$ with the current detecting resistors 13 and 14 rises according to the current $I_L$, and a current detecting element 15 is turned ON when the voltage $V_C$ exceeds a threshold value ($V_{TH}$) of the current detecting element 15. Therefore, a gate voltage $V_G$ of the power switch element 2 drops to a ground level since the gate is grounded via a grounding terminal 23, and the power switch element 2 is turned OFF.

Subsequently, the drop of the gate voltage $V_G$ of the power switch 30 element 2 causes the voltage $V_T$ obtained by dividing the gate voltage $V_G$ with the resistors 11 and 12 to drop. Here, the OFF-time delaying circuit 3 causes the falling of the voltage $V_{T1}$ applied to the gate voltage detecting element 16 to delay for a predetermined delay time. When the voltage $V_{T1}$ drops to a level lower than the threshold value of the gate voltage detecting element 16 after the predetermined delay time, this causes the gate voltage detecting element 16 to be turned OFF, and also the current detecting element 15 to be turned OFF. As a result, again the gate voltage $V_G$ of the power switch element 2 rises, thereby again causing the power switch element 2 to be turned ON.

The rise of the gate voltage $V_G$ of the power switch element 2 causes a voltage $V_T$ obtained by dividing the voltage $V_G$ with the resistors 11 and 12 to rise, and when the voltage $V_{T1}$ via the OFF-time delaying circuit 3 exceeds the threshold value of the gate voltage detecting element 16, the gate voltage detecting element 16 is turned ON.

In the case where the abnormality in the load 17 causes a large current to continue flowing, the device is in an oscillation state in which the foregoing sequence of actions is repeated. However, in the OFF-time delaying circuit 3, the delay time is set for the falling of the voltage $V_T$, so that the oscillation state is made to be such that an OFF time T2 is about 100 times an ON time T1. By so doing, the heat generation of the load driving device 1 can be suppressed to approximately 1/100 of that in the conventional case. It should be noted that an excessively long OFF time T2 is not preferable with a view to stabilization of operations since this causes the response speed to lower in the case where the device is recovered after a temporary load short-circuit or overcurrent occurred.

Figure 3:
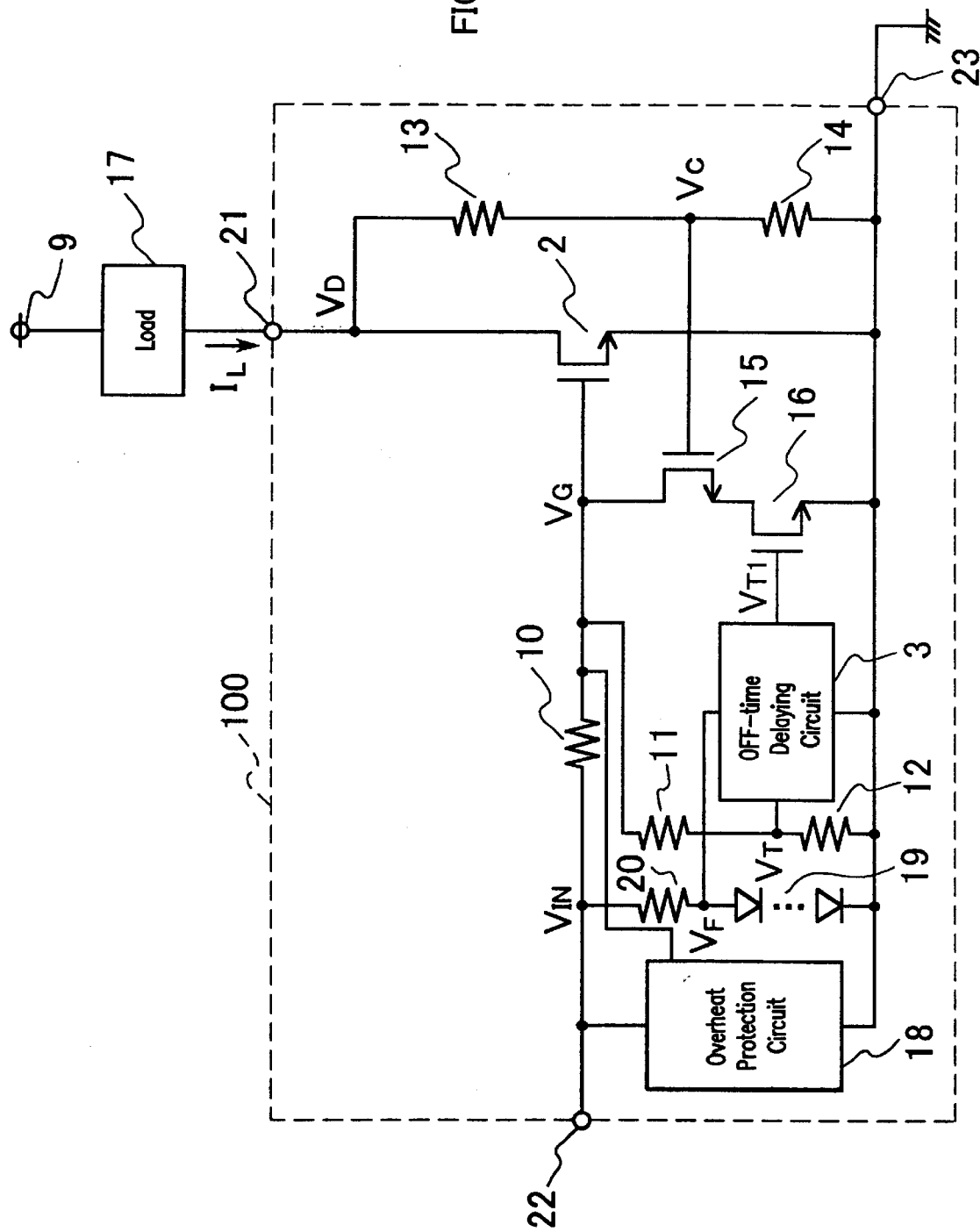
FIG. 3 is a view illustrating a configuration of a load driving device according to a second embodiment of the present invention.

For instance, when a load short-circuit or an overcurrent occurs, in the case where a power consumption due to the oscillation state of the load current is 10 W and the load driving device has a package with an allowable dissipation of 1 W, conventionally the load driving device 1' immediately generates heat and the overheat protection circuit 18 operates. On the other hand, in the present embodiment, the power consumption is 1/100, that is, 0.1W, and hence the overheat protection circuit 18 whose heating set temperature tends to be varied need not operate. Thus, the reliability of the load driving device 1 can be improved.
Second Embodiment FIG. 3 is a view illustrating a configuration of a load driving device 100 according to a second embodiment of the present invention. It should be noted that, in FIG. 3, the same component elements as those of the first embodiment shown in FIG. 1 are designated with the same reference numerals and descriptions of the same are omitted.

While in the first embodiment the OFF-time delay circuit 3 draws its power from the voltage $V_{IN}$ applied to the input terminal 22, the OFF-time delay circuit 3 in the second embodiment draws its power from a voltage $V_F$ at a connection between a resistor 20 connected with the input terminal 22 and a plurality of diodes 19 connected in series with each other as shown in FIG. 3.

This configuration allows respective forward voltages of the plurality of diodes 19 to decrease due to temperature characteristics when the temperature of the load driving device 100 rises, thereby allowing the voltage $V_F$ as a sum of the respective forward voltages of the diodes 19 to decrease. Such a decrease in the voltage $V_F$ causes an increase in the OFF delay time of the OFF-time delaying circuit 3 drawing its power from the voltage $V_F$, thereby causing an increase in the OFF time T2 of the load current $I_L$. Therefore, when the load driving device 100 is at a high temperature, an operation to prevent further heat generation is carried out.

This makes it possible to set the OFF time T2 shorter at a normal temperature, thereby preventing retardation of the response when the device is recovered from a temporary load short-circuit or an overcurrent, which is a defect in the case where the OFF time T2 is set to be long. Therefore, this allows the load driving device 100 to operate stably.

It should be noted that generally the overheat protection circuit 18 is provided with identical circuit elements to the resistor 20 and the plurality of diodes 19 to detect a temperature, and it is possible to decrease the number of component elements by causing the OFF-time delaying circuit 3 to draw its power from the foregoing circuit elements.

As described above, according to the present invention, it is possible to achieve a specific effect of preventing the load driving device surely from undergoing thermal destruction even when a load short-circuit or an overcurrent occurs, and hence improving of the reliability of the device.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A load driving device including a power switch element, whose source is connected to a ground terminal, for driving a load and a control circuit for controlling the power switch element according to a signal supplied from an input terminal, the power switch element and the control circuit being provided on one chip, wherein the control circuit comprises:
   a first resistor connected between a gate of the power switch element and the input terminal;
   a series circuit of a gate voltage detecting element and a current detecting element, the series circuit being connected between the gate and the source of the power switch element; and
   an OFF-time delaying circuit for outputting an output signal obtained by delaying only an OFF-time transition of an input signal level of the power switch element, and driving the gate voltage detecting element according to the output signal;
   wherein the current detecting element monitors a voltage between a drain terminal and the ground terminal and turns ON when the voltage exceeds a threshold value.

2. The load driving circuit according to claim 1, wherein the gate voltage detecting element is a transistor.

3. The load driving circuit according to claim 1, wherein the power switch element is a transistor.

4. The load driving circuit according to claim 1, wherein the OFF-time delaying circuit delays the OFF-time transition of the input signal level for a period according to a temperature rise of the load driving device.

5. The load driving circuit according to claim 4, further comprising an overheat protection circuit that detects a temperature and turns the power switch element OFF according to the detected temperature,
   wherein the OFF-time delaying circuit delays the OFF-time transition of the input signal level according to the temperature detected by the overheat protection circuit.

6. The load driving circuit according to claim 4, wherein the control circuit includes:
   a second resistor connected to the input terminal; and
   a diode series circuit including a plurality of diodes connected in series in a forward direction, the diode series circuit being connected in series to the second resistor;
   wherein the OFF-time delaying circuit is powered by a voltage between both terminals of the diode series circuit, which is obtained by connecting a series circuit of the second resistor and the diode series circuit between the input terminal and the source of the power switch element.

7. The load driving device according to claim 1, wherein the power switch element includes an N-channel MOSFET.

8. The load driving device according to claim 1, wherein the power switch element includes an insulated-gate bipolar transistor.

9. The load driving circuit according to claim 1, wherein the current detecting element is a transistor.

10. A load driving device including a power switch element, whose source is connected to a ground terminal, for driving a load and a control circuit for controlling the power switch element according to a signal supplied from an input terminal, the power switch element and the control circuit being provided on one chip, wherein the control circuit comprises:
    a first resistor connected between a gate of the power switch element and the input terminal;
    a series circuit of a gate voltage detecting element and a current detecting element, the series circuit being connected between the gate and the source of the power switch element; and
    an OFF-time delaying circuit, which draws its power from the signal supplied from the input terminal, for outputting an output signal obtained by delaying only an OFF-time transition of an input signal level of the power switch element, and driving the gate voltage detecting element according to the output signal;
    wherein the current detecting element monitors a voltage between a drain terminal and the ground terminal and turns ON when the voltage exceeds a threshold value.

* * * * *